(12) United States Patent  
Sayers

(10) Patent No.: US 8,218,687 B2  
(45) Date of Patent: Jul. 10, 2012

(54) FREQUENCY DEPENDENT I/Q IMBALANCE ESTIMATION

(75) Inventor: Anthony D. Sayers, Redhill Surrey (GB)

(73) Assignee: ST-Ericsson SA, Plan-les-Ouates (CH)

( * ) Notice: Subject to any disclaimer, the term of this patent is extended or adjusted under 35 U.S.C. 154(b) by 574 days.

(21) Appl. No.: 12/395,549

(22) Filed: Feb. 27, 2009

(65) Prior Publication Data

US 2010/0008449 A1    Jan. 14, 2010

Related U.S. Application Data

(63) Continuation-in-part of application No. PCT/IB2007/053481, filed on Aug. 29, 2007.

(30) Foreign Application Priority Data

Aug. 31, 2006  (EP) ..................... 06119949

(51) Int. Cl.  
*H03K 9/06* (2006.01)

(52) U.S. Cl. ........ 375/322; 375/316; 375/324; 375/340; 375/344; 375/345; 455/309; 455/313; 455/324; 329/318; 329/319; 329/320; 329/327; 329/350; 329/351; 329/353

(58) Field of Classification Search .................. 375/316, 375/322, 324, 340, 344, 345; 455/309, 313, 455/324; 329/318, 319, 320, 327, 350, 351, 329/353

See application file for complete search history.

(56) References Cited

U.S. PATENT DOCUMENTS

| 5,872,538 | A | 2/1999 | Fowler |
| 7,158,586 | B2 * | 1/2007 | Husted ......................... 375/324 |
| 2003/0072393 | A1 | 4/2003 | Gu |
| 2003/0206603 | A1 | 11/2003 | Husted |

FOREIGN PATENT DOCUMENTS

GB    2 215 544 A    9/1989

OTHER PUBLICATIONS

Green, R. A., "An Optimized Multi-Tone Calibration Signal for Quadrature Receiver Communication Systems," Proceedings of the Tenth IEEE Workshop on Statistical Signal and Array Processing, Pocono Manor, PA, Aug. 14-16, 2000, pp. 664-667.

* cited by examiner

*Primary Examiner* — Leon Flores  
(74) *Attorney, Agent, or Firm* — Potomac Patent Group PLLC

(57) ABSTRACT

A receiver estimates I/Q imbalance in I and Q input signals using circuitry to separate different frequency components of the I and Q input signals, and estimation circuitry arranged to estimate I/Q imbalance at the different frequency bands. The separating of the bands may be carried out in the frequency domain, and may involve combining corresponding values representing corresponding negative and positive frequency bands, and converting the separated frequency domain representations to a time domain representation before the estimation. The estimated imbalance may be used to correct the I and Q signals at the different frequency bands.

11 Claims, 10 Drawing Sheets

FREQUENCY DEPENDENT I/Q IMBALANCE ESTIMATION

BACKGROUND

1. Technical Field

This disclosure relates to devices having frequency dependent I/Q imbalance estimation, and to corresponding methods, software and integrated circuits.

2. Technical Field

RF receivers or transmitters of any type typically have mixers driven by a local oscillator to generate I and Q signals in quadrature, i.e., 90 degrees out of phase with each other with the result that there is no correlation between the two signals. As explained in US patent application 2003206603, it is well known in the art that deviations from the ideal I and Q signals can occur in the form of gain or magnitude imbalances, and relative phase imbalances. This can cause an unwanted image in a negative frequency part of a spectrum of the received signal, which can lead to interference or errors in subsequent processing stages such as demodulation, or filtering or algorithms to extract wanted signal components.

The phase imbalance can arise from local oscillator (LO) input signals to mixers not being exactly 90 degrees out of phase, or from path length differences, or errors caused by unbalanced parasitic capacitance, for example. Prior attempts to calibrate and correct for magnitude and phase imbalances have involved applying dedicated calibration signals at the receiver, for example, by switching the local oscillator to generate in-phase signals rather than out-of-phase signals. The resulting signals are analyzed to produce correction factors to be applied to received signals carrying data of interest, either at the analogue side or the digital side. R. A. Green, in "An Optimized Multi-tone Calibration Signal for Quadrature Receiver Communication Systems," 10th IEEE Workshop on Statistical Signal and Array Processing, pp. 664-667, Pocono Manor, Pa., August 2000, shows an optimized multi-tone calibration signal to which linear regression techniques are applied to generate correction factors to update adaptive filters that are intended to compensate for gain and phase imbalances. Special circuitry typically needs to be used to produce, analyze, and correct for the results of analysis on such calibration signals. A further drawback is that the quadrature receiver typically cannot continue to actively receive normal transmitted data while the calibration is occurring.

US patent application 2003/206603 tries to provide I/Q calibration at a quadrature receiver that does not require that a separate calibration signal be transmitted to the receiver and that does not necessarily involve additional analogue components prior to the analogue to digital converters (ADCs). It achieves this by having an initial calibration period during which the local oscillator outputs are switched to feed in-phase signals to both mixers. Two switches (204, 206) and two phase shifters (208, 210) as well as the oscillator itself (280) are arranged to provide either (a) two LO output signals that are 90 degrees out of phase or (b) two LO output signals that are in phase (0 degrees out of phase). Mode (a) is used for normal operation of the receiver and mode (b) is used for the calibration period. One disadvantage of this is that the receiver cannot be used while it is being calibrated. I/Q imbalance factors in terms of phase and amplitude, are determined at different frequency bands, during the calibration period, using either frequency domain or time domain separation of frequency bands. These are then used to correct the I/Q imbalance when receiving signals in normal operation of the radio, with the LO signals 90 degrees out of phase.

One embodiment, shown in FIG. 9 of US2003/206603, is said to be capable of performing I/Q calibration and compensation and does not require a special switched local oscillator LO arrangement for an initial calibration period, for frequency independent imbalance estimation. However, it states that for frequency dependent phase mismatch (FDPM), the system does need the initial calibration period with the LO being switched to provide signals of equivalent phase to the mixers.

U.S. Pat. No. 5,872,538 (Fowler) shows frequency dependent I/Q imbalance correction, and shows a method of implementing it using a single complex FFT. Correction factors are obtained using a prior calibration process.

BRIEF SUMMARY

According to one embodiment, there is provided signal processing apparatus for estimating I/Q imbalance in in-phase (I) and quadrature-phase (Q) input signals, comprising circuitry arranged to separate different frequency components of the I and Q input signals to represent different parts of a frequency spectrum of the input signals, and estimation circuitry arranged to estimate I/Q imbalance at the different parts of the frequency spectrum of the input signals.

Compared to the above referenced existing methods of frequency dependent estimation, this apparatus has the notable consequence of enabling a "fully passive" estimation of frequency dependent imbalance. In other words an estimation which does not need a prior calibration period, or a test signal for calibration of the estimation, and may continuously estimate a changing imbalance while receiving live input signals carrying a useful information payload. This can help reduce errors in reception and can improve the performance of downstream processing such as demodulation, while avoiding or reducing the inconvenience of sending test signals or the expense or losses or uncorrected signal delays which can be introduced by switched LO circuitry.

Any additional features may be added, and some such additional features are described and claimed.

Other aspects include a corresponding integrated circuit, a corresponding receiver and a corresponding method of estimation, and corresponding software for carrying out the method. Additional features and advantages will be described below. Any of the additional features can be combined together or with any of the embodiments, as would be apparent to those skilled in the art. Other advantages may be apparent to those skilled in the art, especially over other prior art not known to the inventors.

BRIEF DESCRIPTION OF THE SEVERAL VIEWS OF THE DRAWINGS

Embodiments will now be described by way of example, and with reference to the accompanying drawings, in which.

DETAILED DESCRIPTION

Figure 1:
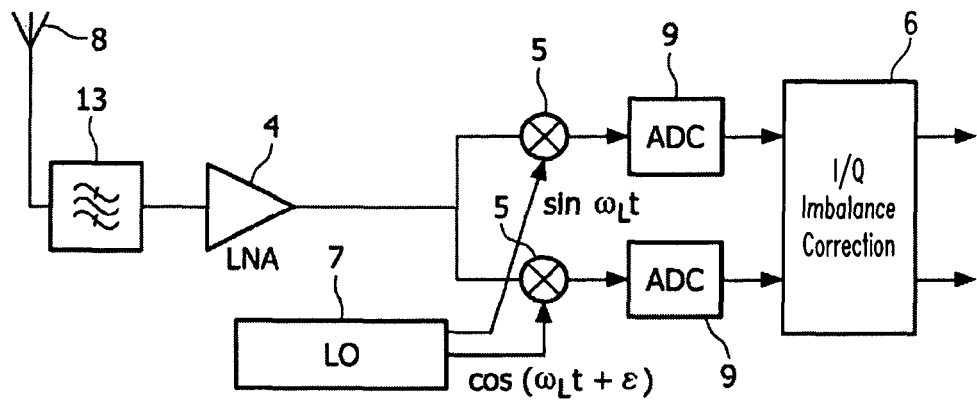
FIG. 1 shows a schematic view of a receiver to which some embodiments can be applied.

The present disclosure relates to an apparatus for estimating frequency dependent I/Q imbalance errors. Some of the additional features of embodiments can be summarized as follows. The circuitry arranged to separate the frequency bands may comprise transform circuitry for generating a frequency domain representation of the input signals, and the separating of the frequency bands being carried out in the frequency domain.

The separating of the frequency bands may involve separating transformed values into a number of frequency bins representing values in negative and positive frequency bands, and combining corresponding values in bins representing corresponding negative and positive frequency bands. The apparatus may have a converter to convert the separated frequency domain representation of each frequency band to a time domain representation before the estimation.

The estimation circuitry may be arranged to determine an estimate of a phase imbalance and an estimate of an amplitude imbalance. The phase imbalance determining circuitry may be arranged to determine an average amount of correlation of the I input signal and the Q input signal, over a period of time. The amplitude imbalance determining circuitry may be arranged to determine an average difference between the amplitudes of the input signals over a period of time. Where the phase imbalance is determined on input signals before correction for amplitude imbalance, a polynomial correction may be carried out to compensate for the effects of amplitude imbalance on the phase imbalance.

The apparatus may have correction circuitry arranged to use the estimated imbalance to correct the input signals. The estimation may be carried out before or after the correction. The correction may be carried out in the frequency domain or the time domain. The correction may be based on equations:

$$x'(t)=x(t)\cdot(1-\text{alpha})+\text{beta}\cdot y(t)$$

$$y'(t)=y(t)\cdot(1+\text{alpha})+\text{beta}\cdot x(t)$$

where alpha is a vector of amplitude imbalances at different frequency bands, beta is a vector of phase imbalances at different frequency bands, x is the I input signal and y is the Q input signal, x and y being in the form of vectors of signal values at different frequency bands. The apparatus may be implemented in the form of an integrated circuit. The correction based on the detected imbalance may be carried out anywhere upstream or downstream of the detection.

Embodiments may be in the form of a receiver and may incorporate a local oscillator to produce quadrature signals, a pair of mixers to mix a received signal with the quadrature signals, to generate I and Q signals, an analogue to digital converter, to convert the I and Q signals, and the above signal processing apparatus to detect imbalance in the I and Q signals.

Embodiments may be in the form of a method of receiving involving using a local oscillator to produce quadrature signals, mixing a received RF signal with the quadrature signals, to generate I and Q signals, converting the I and Q signals to digital form, and detecting an imbalance in the I and Q signals by separating different frequency components of the I and Q input signals, to represent different parts of a frequency spectrum of the input signals, and estimating I/Q imbalance at the different parts of the frequency spectrum of the input signals.

Embodiments may be in the form of computer software for use by the apparatus and arranged to detect an imbalance in the I and Q signals by separating different frequency components of the I and Q input signals, to represent different parts of a frequency spectrum of the input signals, and to estimate I/Q imbalance at the different parts of the frequency spectrum of the input signals.

References to circuits or circuitry can include any kind of hardware including analogue or digital circuitry, general purpose microprocessors, digital signal processor (DSP) circuitry, application specific integrated circuits (ASICs) and so on, and can encompass circuitry and associated software to be executed by the circuitry to implement a given function. Items shown as separate circuits may be separated at different places or integrated in different ways.

In some embodiments, the frequency components of an incoming signal are separated using a Fast Fourier Transform (FFT). Positive and negative frequency components with the same magnitude are then recombined, and the resulting signals processed using a known algorithm to obtain a vector of correction values for different frequencies that can be applied to compensate the incoming signal. This arrangement can correct frequency dependent signal path errors more accurately than systems based on a correction at one frequency. A further improvement on the known estimation algorithm is also described.

The apparatus can be used to improve the image rejection of modern CMOS-implemented radio receivers. A modern integrated radio receiver is shown in FIG. 1. The device includes an antenna 8 that receives RF signals, followed by a band-defining filter 13 that filters out all signals except those in a band around the wanted signal. The low noise amplifier (LNA) 4 amplifies all the signals passed by the band pass filter 13, and the purpose of the rest of the radio receiver is to select the wanted signal from any other signals that are not filtered out by the band-defining band pass filter 13.

In order to process the radio signal further, the signal from the LNA 4 is separated into what are known as I and Q components. In order to do this, using mixers 5, the signal is multiplied by ("mixed with") two local oscillator signals that are ideally in quadrature (90 degrees apart and generated by local oscillator 7), and thus can be represented as $\sin \omega_L t$ and $\cos \omega_L t$. In the radio receiver of FIG. 1, a mismatch error has been shown and the local oscillator signals are not 90 degrees apart; there is an error represented by $\epsilon$. This is only one possible type of error that can occur in the signal path, but it will lead to errors in the processing that follows if not corrected. An I/Q imbalance estimation and correction part 6 is shown, following conversion to digital signals by analogue to digital converters (ADCs) 9.

Figure 2:
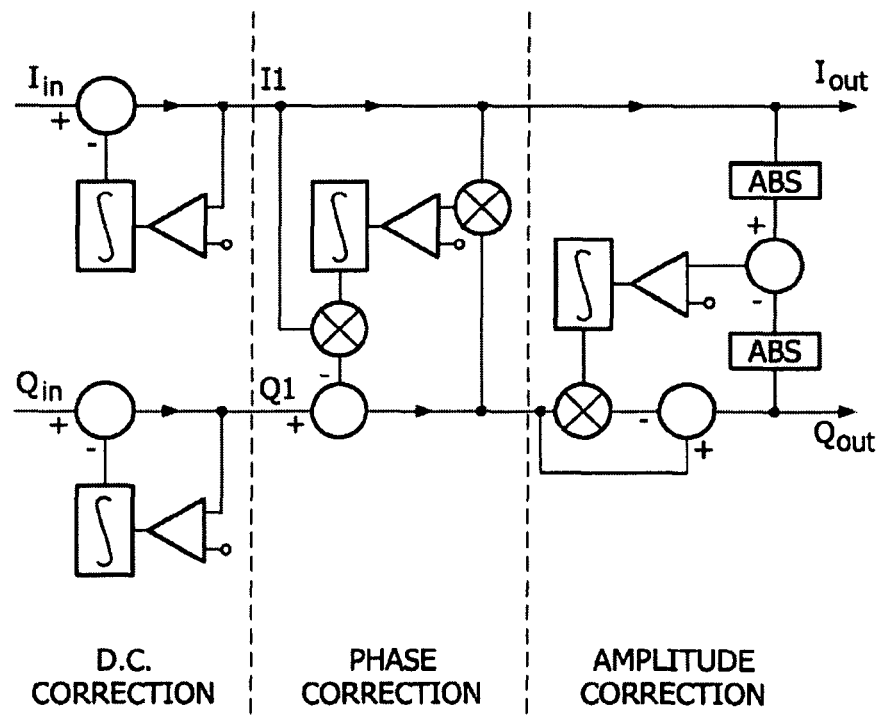
FIG. 2 shows a schematic view of a known example for use in frequency independent estimation, and adapted in some embodiments.

Errors in the form of imbalance in I/Q signals of radio systems can often be detected relatively easily, based on the fact that the outputs of the I and Q branches should be uncorrelated, no matter what the signal input to the radio is. If however there is an error as shown above, there is some correlation. This is because:

$$\cos(\omega_L t+\epsilon)=\cos \omega_L t \cos \epsilon - \sin \omega_L t \sin \epsilon$$

and so there is a component in the $\cos \omega_L t$ branch that has been multiplied by $\sin \omega_L t$. A previous patent disclosed a method of detecting frequency independent errors: GB2215544, (Cheer) published on $20^{th}$ Oct. 1989: "Apparatus for the correction of frequency independent errors in quadrature zero IF radio architectures." A diagram from the patent is shown in FIG. 2. This will now be explained further, as a similar algorithm is used in some embodiments of the invention, with adaptations to enable frequency dependent operation, in other words detection and correction at a number of different frequencies. FIG. 2 shows three stages, a first stage to apply DC correction, a second stage to estimate and correct phase imbalance, and a third stage to estimate and correct amplitude imbalance.

Following the DC correction (which is important in Zero IF receivers, but less important in other applications) the next stages shown in FIG. 2 work as follows: the phase is corrected by multiplying together the I and Q components, integrating the result and adding a small amount of the I channel into the Q channel. Next the amplitudes of the two paths are corrected by detecting an average difference in absolute values then simply applying an appropriate amount of amplification in one path. Although this approach seems in GB2215544 to be somewhat modular and ad-hoc, it can be shown that it does effectively detect the correlation between I and Q channels. However it is unable to deal with frequency dependent errors. Although the variation of the errors may be quite small, due to the fact that the total bandwidth of the receiver is much smaller than the RF bandwidth, this variation will become important when high accuracy is required, as when attempting to achieve very good image rejection in a modern CMOS based radio receiver. Some embodiments make use of a similar algorithm, but arranged to deal with frequency dependent errors.

A component of some embodiments of this disclosure is a Fast Fourier Transform (FFT) to separate out the frequency components of the I and Q signals. However, the algorithm applied in GB2215544 (Cheer) cannot be applied to the separated out components directly, as it requires knowledge of both the positive and negative components of a given frequency value. The output of the FFT will consist of positive and negative frequencies, and the basis of the new algorithm is to collect FFT bins that have identical frequency magnitudes but opposite signs. These components are added together and effectively put into an inverse FFT, converting the signal back into a time-based waveform that only contains frequencies (positive and negative) in the band defined by the FFT bin. If the original FFT has 2N bins, there will be N−1 such signals (DC does not require correction). These N−1 time-based waveforms are then applied to an algorithm corresponding to that shown in Cheer, resulting in N−1 sets of correction coefficients.

The correction coefficients are then applied to the signal components output by the FFT (for frequency domain correction as shown in Fowler) or as output by the inverse FFT, for time domain correction as shown in Cheer. Each set of correction coefficients is used twice, once for the negative frequency component and once for the positive frequency component.

Embodiments of the present disclosure show an I & Q demodulation system with frequency dependent quadrature mismatch correction by: FFT conversion of I & Q signals, adding the positive and negative frequency bins of same frequency value and carrying out an IFFT on each of these sum bins to get time domain signals of the frequency bin and generate an imbalance value for each frequency band. The imbalance values may be used in any way to compensate the input signal, or to compensate downstream applications using the input signal. One way of using these values is to apply the values to each frequency bin of the FFT output, to generate frequency dependent mismatch corrected signals. These corrected signals relating to different frequency bins may be combined to create corrected I and Q signals.

In some embodiments, I and Q signals in a radio apparatus are processed using a Fast Fourier Transform (FFT) to separate out the frequency components of these signals. Positive and negative frequency components with the same magnitude are combined and an inverse FFT applied to convert the signals back into the time domain, resulting in a set of time-domain waveforms each containing only frequencies with magnitudes corresponding to a pair of FFT bins. These frequency-dependent waveforms are used to generate correction coefficients any known method for frequency-independent correction, and then the correction coefficients are used for frequency-dependent correction of the signal components output by the FFT. This can provide improved image rejection in applications such as narrowband radio receivers, e.g., for GSM/EDGE.

Figure 3:
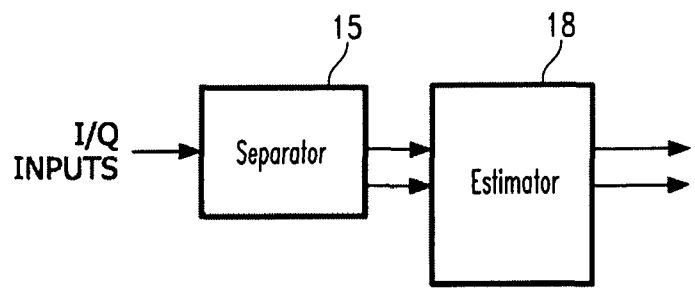
FIG. 3 shows a schematic view of an imbalance estimation arrangement according to an embodiment.

FIG. 3 shows a first embodiment, to estimate I/Q imbalance in I and Q input signals. These input signals are fed to separation circuitry 15 to separate different frequency components of the I and Q input signals, to represent different parts of a frequency spectrum of the input signals. The separated signals are fed to estimation circuitry 18 arranged to estimate I/Q imbalance at the different parts (in other words frequency bands) of the frequency spectrum of the input signals. Correction using the estimated values may be added at various places in the I and Q signal paths. Various ways to implement the circuitry can be envisaged and many additions can be envisaged, and some will be described in more detail.

Figure 4:
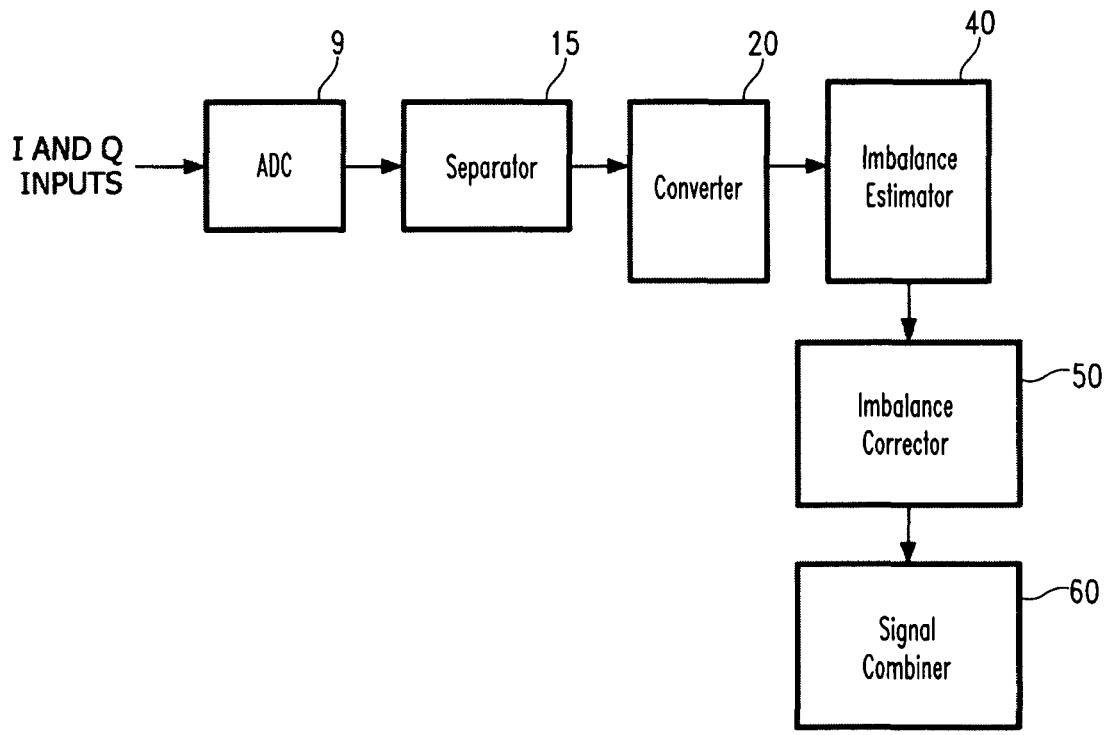
FIG. 4 shows a schematic view of an imbalance estimation and correction arrangement according to an embodiment.

FIG. 4 shows another embodiment for carrying out estimation. ADC converters 9 to convert I and Q inputs to digital domain are followed by separation circuitry 15 to separate different frequency components of the I and Q input signals, to represent different parts of a frequency spectrum of the input signals. Signals for each band are converted by conversion circuitry 20 into time domain signals, and time domain I/Q imbalance estimation for each band is carried out by imbalance estimation part 40. The estimation values for each frequency band are fed to I/Q imbalance correction part 50 for correction of each frequency band. In combining part 60, the corrected I/Q signals of different frequency bands are recombined to output a corrected signal.

Figure 5:
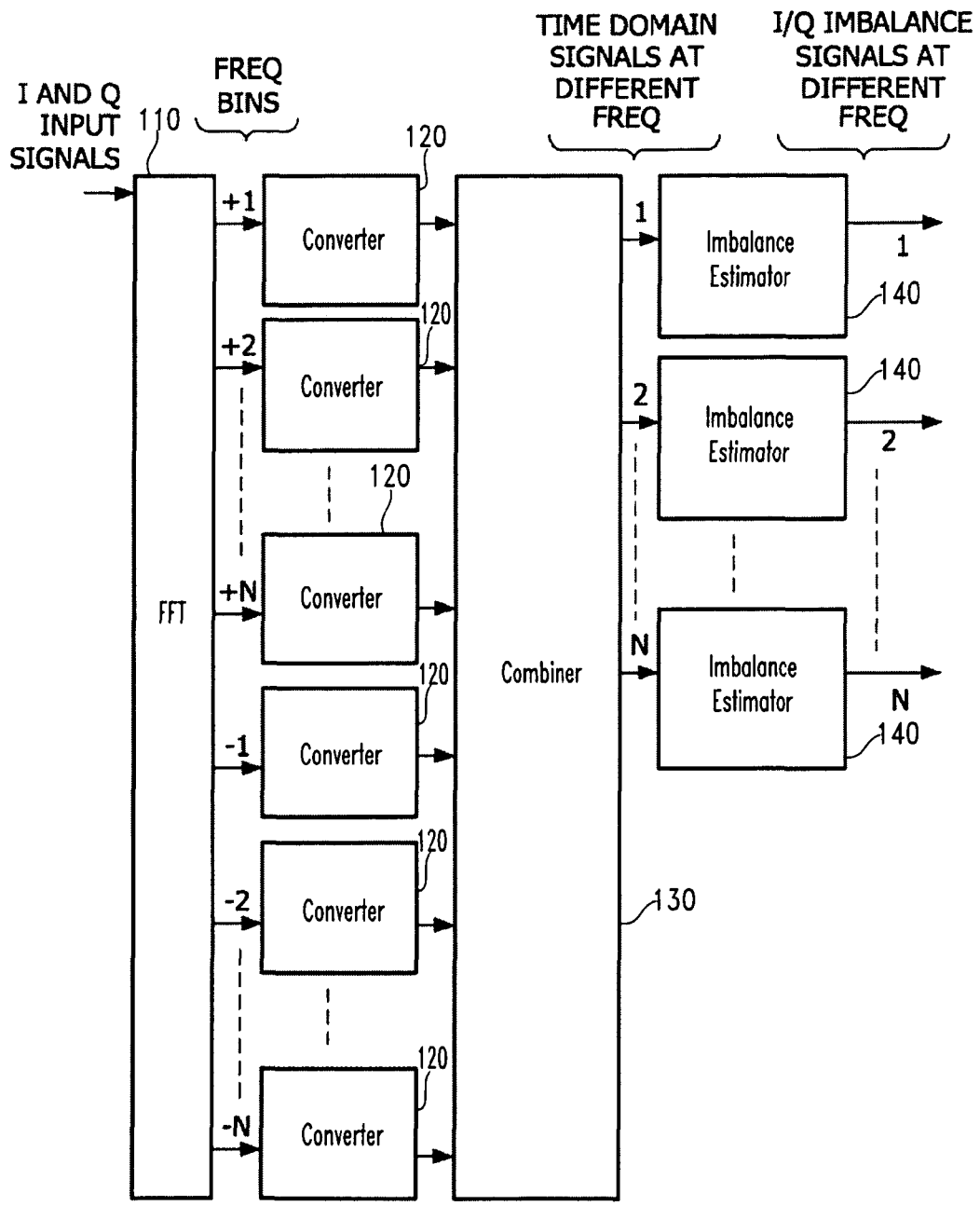
FIG. 5 shows a schematic view of an imbalance estimation arrangement according to an embodiment.

FIG. 5 shows another embodiment of estimation circuitry. The I and Q signals are fed to transform circuitry 110 in the form of an FFT circuit for example. Other transforms could be used. Outputs in the form of frequency domain signals are separated into frequency bins, shown as +1 to +N and −1 to −N, according to positive and negative frequency bands 1 to N. Each of these bands are converted to time domain signals by conversion circuitry 120, and kept separate. Then they are combined by combining circuitry 130 for combining the time domain signals of corresponding positive and negative frequencies, to output time domain signals for bands 1 to N. Each of these are fed to time domain imbalance estimation circuitry 140. Each arrow shown in FIG. 5 represents two signal streams, for I and Q values, or complex values representing both I and Q signals. The outputs are I and Q imbalance signals, each representing imbalance at frequencies 1 to N.

Figure 6:
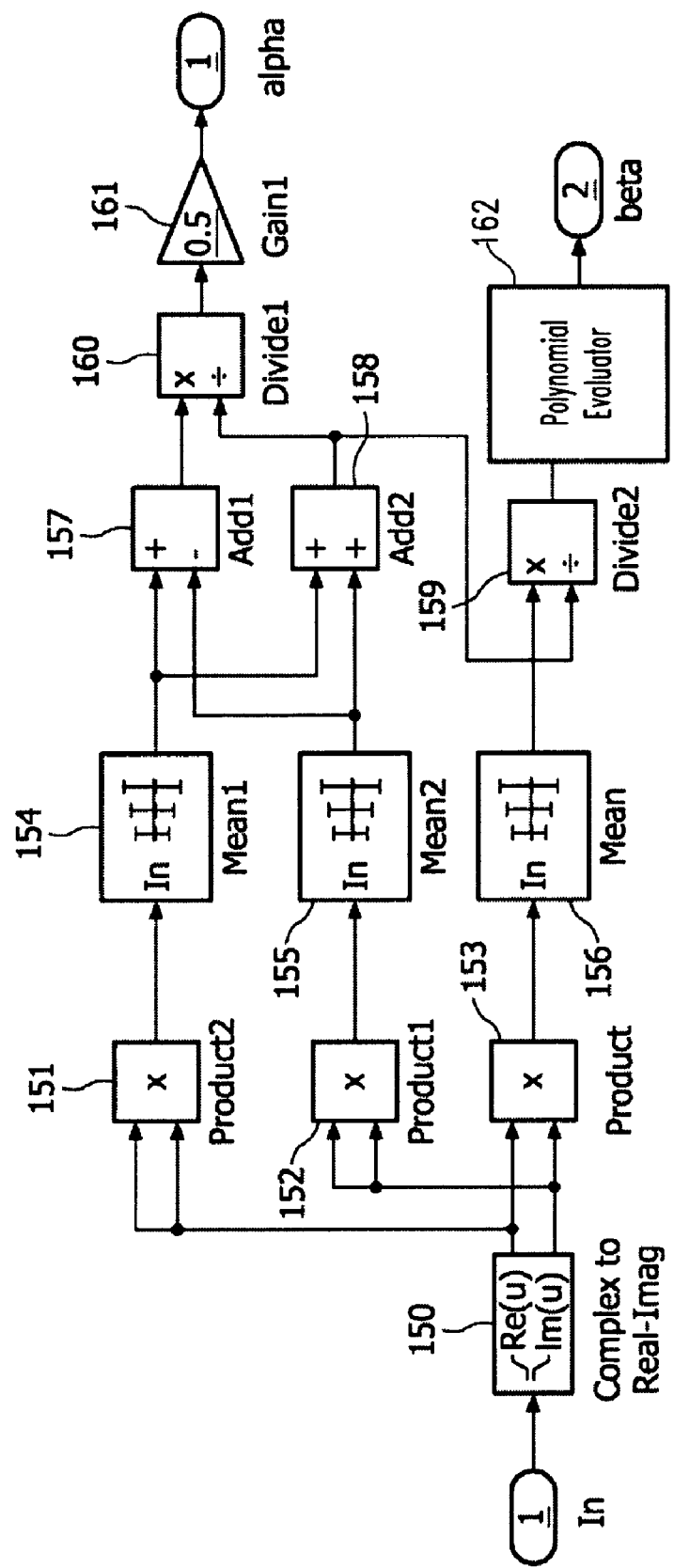
FIG. 6 shows a schematic view of another imbalance estimation arrangement according to an embodiment.

FIG. 6 shows a schematic view of an example of how to implement the estimation of imbalance as in box 18 of FIG. 3, box 40 of FIG. 4, or box 140 of FIG. 5 for the preceding embodiments or other embodiments, to calculate alpha (the amplitude correction) and beta (the phase correction). These are similar to estimation values W1 and W2 of Cheer. As in the above mentioned Cheer patent, I and Q are multiplied together and integrated to give the beta parameter, and the difference in the magnitudes is used to calculate alpha. Both parameters are scaled with the amplitude of the original signal.

As shown in FIG. 6, the I and Q input signals in the form of a time series of complex values are first of all separated by the part 150 labelled complex to real-imag. Three multipliers are shown, Product 153, Product1 152 and Product2 151. Product2 is used to square the real part, effectively to obtain an absolute value, as is also carried out by Cheer as shown in the amplitude correction part of FIG. 2. Product1 is used to obtain a square of the imaginary part of the input, again as done in FIG. 2. Parts Mean1 154 and Mean2 155 take average values of the squares output by Product2 and Product1, respectively, equivalent to the integrating function in the amplitude correction part of FIG. 2. Part Add1 157 in FIG. 6 obtains a difference in the averaged values output by the Mean1 and Mean2 parts. Add2 158 and Divide1 160 and Gain1 161 parts are used to scale this difference, which is then output as the amplitude imbalance value alpha. This output may be calculated for each of the different frequency bands by providing as the input to FIG. 6, a time domain signal for a given frequency band, and repeating the algorithm in series or parallel for different input signals for different frequency bands.

In FIG. 6 the phase imbalance estimation is carried out using the multiplier labelled Product 153 to carry out a correlation. The output of this part is averaged by the averaging part labelled Mean 156. The output of this is scaled by parts Add2 158 and Divide2 159. This much follows the principles of the phase estimation shown in FIG. 2.

Regarding the phase imbalance estimation, there is an improvement on the original algorithm shown in FIG. 2. As the amplitude of the signal used for scaling is calculated using the uncorrected signal, this is slightly wrong, by an amount that can be determined to a first order using the value of beta from the initial calculation. This can be corrected to a first order by the polynomial evaluation block 162 shown in FIG. 6, which implements the polynomial $y=x+x^3$, slightly correcting the input value x when x is small. The output of the polynomial evaluation is the value beta. Again this beta output can be calculated for each of the different frequency bands by providing as the input to FIG. 6, a time domain signal for a given frequency band, and repeating the algorithm in series or parallel for different input signals for different frequency bands.

Figure 7:
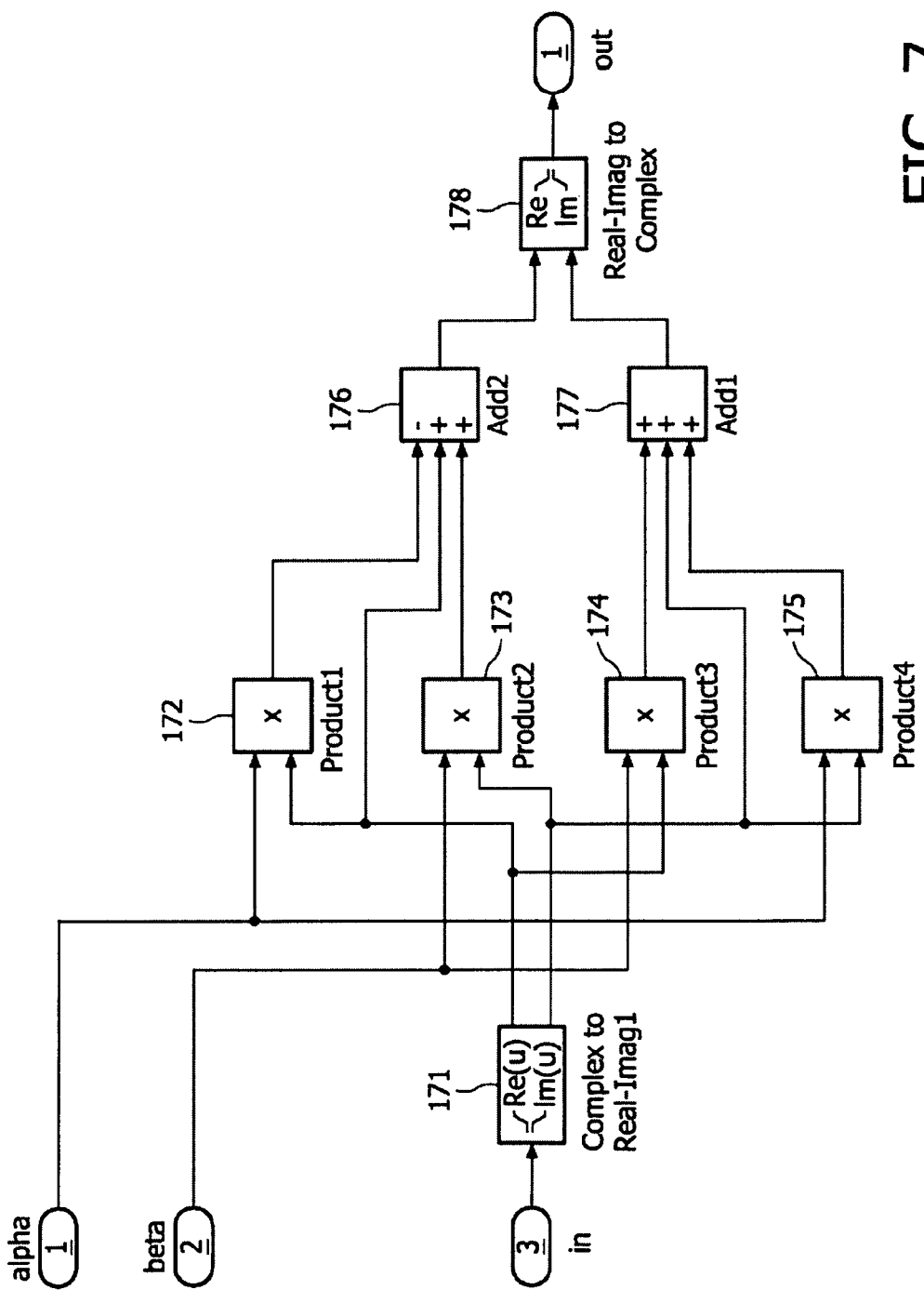
FIG. 7 shows a schematic view of a further imbalance correction arrangement according to an embodiment.

The imbalance correction parameters alpha and beta calculated by the circuitry shown in FIG. 6 may be used by the imbalance correction block 50 of FIG. 4. FIG. 7 shows a schematic view of an example of how to implement the correction block for the preceding embodiments or other embodiments, using the alpha and beta correction components of imbalance as generated according to FIG. 6 or other embodiments. FIG. 7 shows the estimated imbalance parameters alpha and beta being applied to correct the I and Q signals. Note that the correction would be done to each of the time domain signals at different frequencies as shown in FIG. 5.

The equations implemented here are:

$x'(t)=x(t)\cdot(1-\text{alpha})+\text{beta}\cdot y(t)$ $y'(t)=y(t)\cdot(1+\text{alpha})+\text{beta}\cdot x(t).$ The parameter alpha is used to adjust the relative amplitude of the signals. If x(t) is bigger than y(t), alpha can be increased to compensate for this. The phase difference between the two paths is adjusted by adding beta times one path into the other, as in much previous work, including [Cheer].

FIG. 7 shows four multipliers, Product1 172, Product2 173, Product3 174 and Product4 175, and two adders, Add2 176 for the real part of the signal and Add1 177 for the imaginary part. The input signal 3 in the form of a time series of digital samples representing complex values is separated into real and imaginary components by the item labelled complex to real-imag1 171. The real part is fed to Product1 and Product3, and the imaginary part is fed to Product2 and Product4. The alpha component 1 (amplitude imbalance) is fed to Product1 and Product4 while the beta component 2 (phase imbalance) is fed to Product2 and Product3. Part Add2 176 produces a sum of the real part of the input and the output of Product2, and subtracts the output of Product1. Part Add1 177 produces a sum of the outputs of Product3, Product4 and the imaginary part of the input. The real and imaginary parts output by respectively Add1 and Add2 are put together into complex values by the part labelled real-imag to complex 178.

Note that the time domain algorithm suggested above is not the only way of doing this, and [Fowler] shows a method of achieving the same result by correction of a frequency domain representation of the signal.

Figure 8:
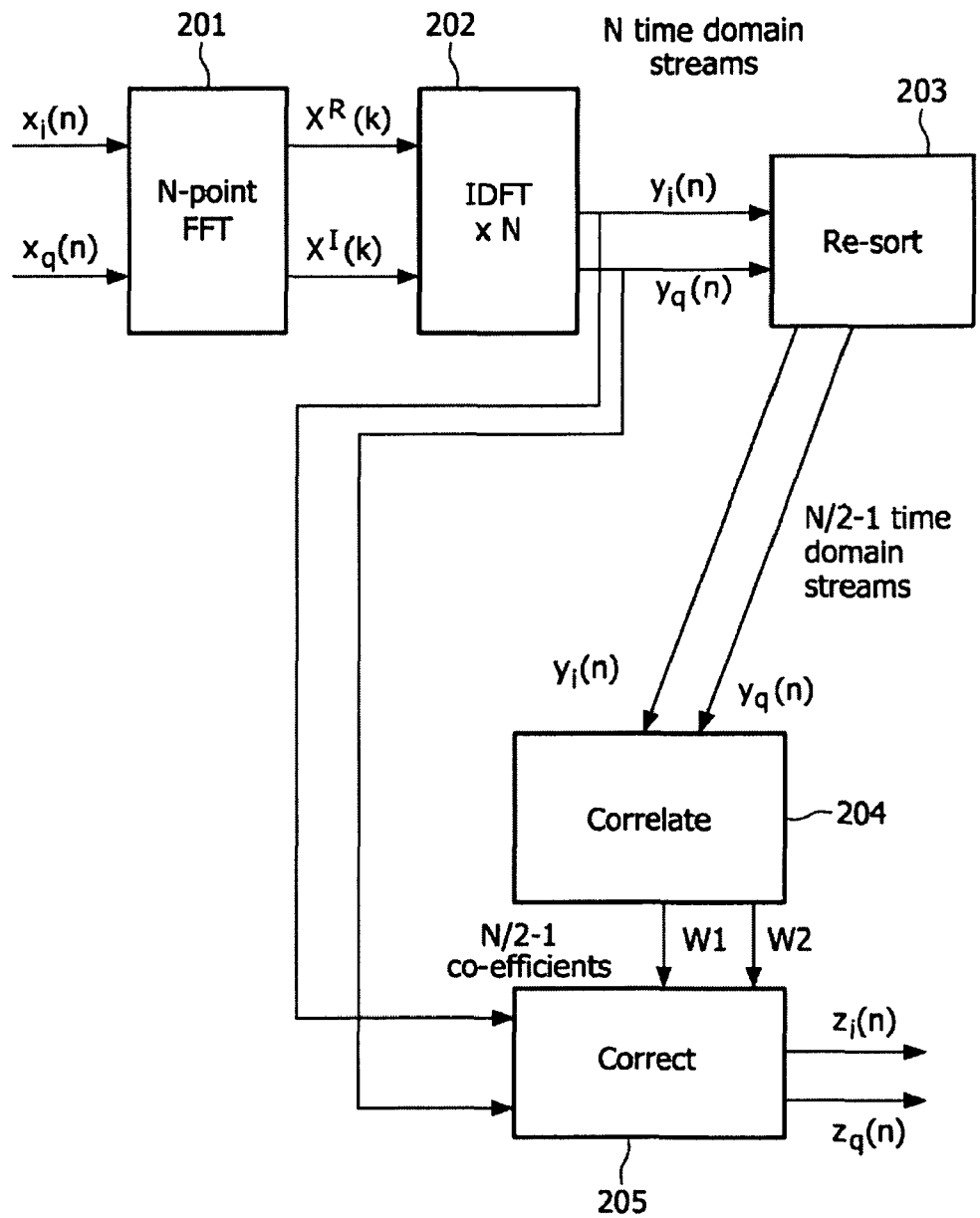
FIG. 8 shows a schematic view of an imbalance estimation and correction arrangement according to an embodiment.

FIG. 8 shows a schematic view of signal processing according to an embodiment and having estimation and correction. As with any of the embodiments it can be implemented in any kind of conventional processing hardware such as a general purpose microprocessor or DSP or ASIC or dedicated logic circuitry, for example, and software for such processing hardware can be written in any conventional computer language. The starting point for the signal processing is, exactly as in [Fowler], an N-point FFT labelled block 201 in FIG. 8.

The input to this block 201 consists of the time-domain I and Q signals of the radio apparatus in question, $x_i(n)$ and $x_q(n)$ using notation from [Fowler], where n represents sample number which increases with time.

The output from block 201 is a frequency domain representation of the signal which is labelled, as in [Fowler], $X^R(k)$ and $X^I(k)$ where k represents frequency bin and increases with frequency, and R and I indicate real and imaginary, respectively.

The signal processing operation performed by the N-point FFT block 201 is well-known, converting N time domain complex samples to N frequency domain complex samples.

In a simple uncorrected radio apparatus, the signal would be recovered from the complex samples directly. In the example shown in the graphs of FIGS. 9 and 10 described below, an interferer is shown at positive frequencies, causing an unwanted image at negative frequencies. This makes it difficult to recover wanted signals at negative frequencies. Therefore, the purpose in this instance of the embodiments of the invention, is to correct, either in the time domain or the frequency domain, the input signal so that the interferer does not appear at negative frequencies (note that the negative frequencies can not simply be removed, because this is where parts of the wanted signal will be).

Block 202 takes each complex frequency bin pair produced by block 1 and produces a time domain waveform from each $X^R(k)$ and $X^I(k)$ pair. This is a new feature, and is not done in [Fowler] where corrections are performed in the frequency domain.

The processing in Block 202 involves multiplication of each $X^R(k)$ and $X^I(k)$ pair with a time domain waveform. This operation can be subject to many simplifications and optimizations known to those working in the signal-processing field, but these are not explored here.

The output of Block 202 consists of N time-domain signals at positive and negative frequencies. Each signal consists of a cisoid (complex sinusoid) of constant amplitude and frequency defined by the input $X^R(k)$ and $X^I(k)$ pair.

In Block 203, the time domain signals generated in Block 202 are combined in the following manner. Each positive frequency cisoid is added to the negative frequency cisoid with the same magnitude. This results in (N/2)−1 time domain waveforms. The number of waveforms is halved by the adding together operation. The algorithm can not be applied to the DC (zero frequency) bin and the twice sampling rate bin, resulting in the "−1" in the number of time domain waveforms. The above operation results in time domain waveforms with both positive and negative frequency information, which can be used to calculate the correction coefficients in the manner described by [Cheer]. Note that the sorting operation described above is completely different to the "Reverse Order" operation described by [Fowler], which operates on signals in the frequency domain. The purpose of the operation described by [Fowler] is different, as described below.

In Block 204, the techniques described in [Cheer] are applied to each of the time domain signals generated by Block 203. The output of Block 203 consists of (N/2−1) I+Q time domain waveforms each containing information from a narrow band of frequencies. Since [Cheer] operates on one I+Q time domain waveform, it can be applied to each of these signals individually resulting in (N/2−1) weighting coefficients W1 and W2, each applicable to a narrow band of frequencies. Block 204 can be implemented as shown in FIG. 6, for example.

In Block 205, the weighting coefficients W1 and W2 as described in [Cheer] are applied to each of the time domain waveforms generated by Block 2 in precisely the manner described in [Cheer]. This is done for both the positive and the negative frequencies, resulting in (N−2) time-domain corrected I+Q waveforms. These signals are then added together to give a single time domain corrected waveform which is the output of the system. Block 205 can be implemented as shown in FIG. 7, for example. The outputs of block 205 are $z_i(n)$ and $z_q(n)$, and correspond to the outputs of FIG. 7. All of the I, and all of the Q values for the different frequency bands can be added, to produce two (I & Q) time domain corrected waveforms, typically each in the form of a series of digital values.

Embodiments of the frequency dependent imbalance estimation system can start from a baseband signal being fed into a 64 point FFT, resulting in a 64 frequency bin output vector. The time waveforms corresponding to each bin are then calculated using the output vector to scale an inverse FFT matrix. The result of this process is a 64×64 matrix the columns of which correspond to time values and the rows of which correspond to frequency values. Thus in an individual row of the matrix is a time waveform with frequency components from one bin of the FFT. The bins corresponding to negative frequencies are then selected and their signals are added to the matrix row for the corresponding positive frequency. This results in a 31×64 matrix, as no calculation is performed for DC and half-sampling frequency components. The 31 resulting time waveforms are then input to the above mentioned algorithm of [Cheer], resulting in 31 correction coefficients, one for each non-zero frequency magnitude of the original FFT.

These correction coefficients are then re-ordered and used as input to a correction block, which can be implemented as described in [Cheer], for example, with each frequency band treated separately.

Figure 9:
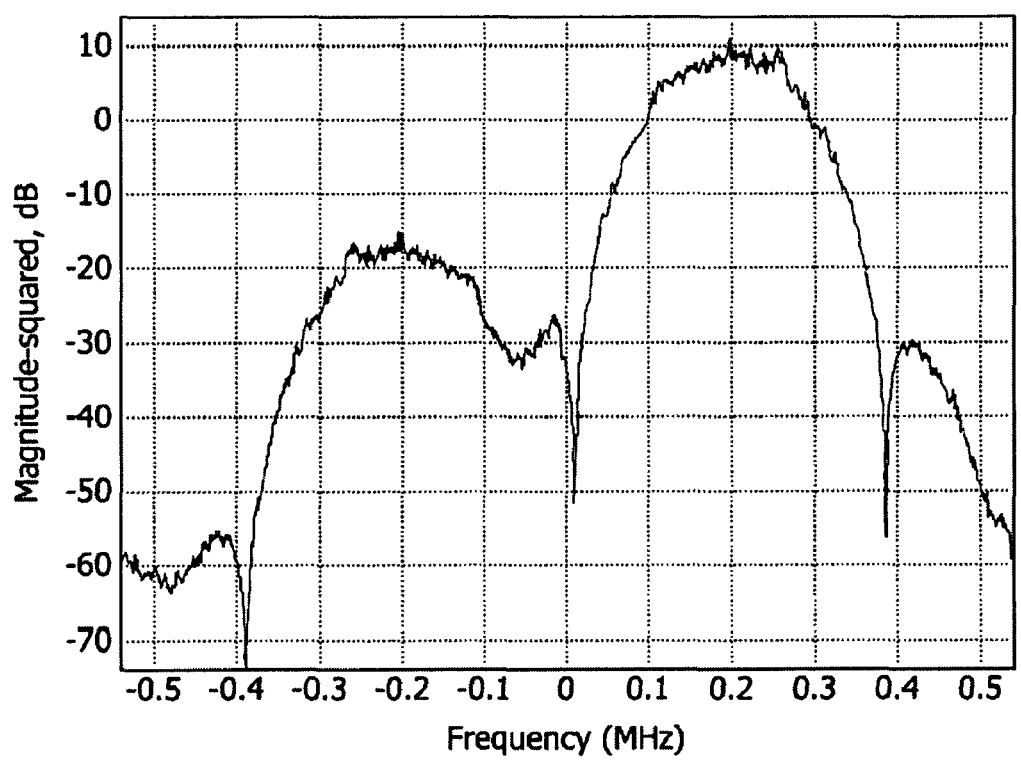
FIGS. 9 and 10 show graphs of frequency spectra with and without frequency dependent correction according to an embodiment.
Figure 10:
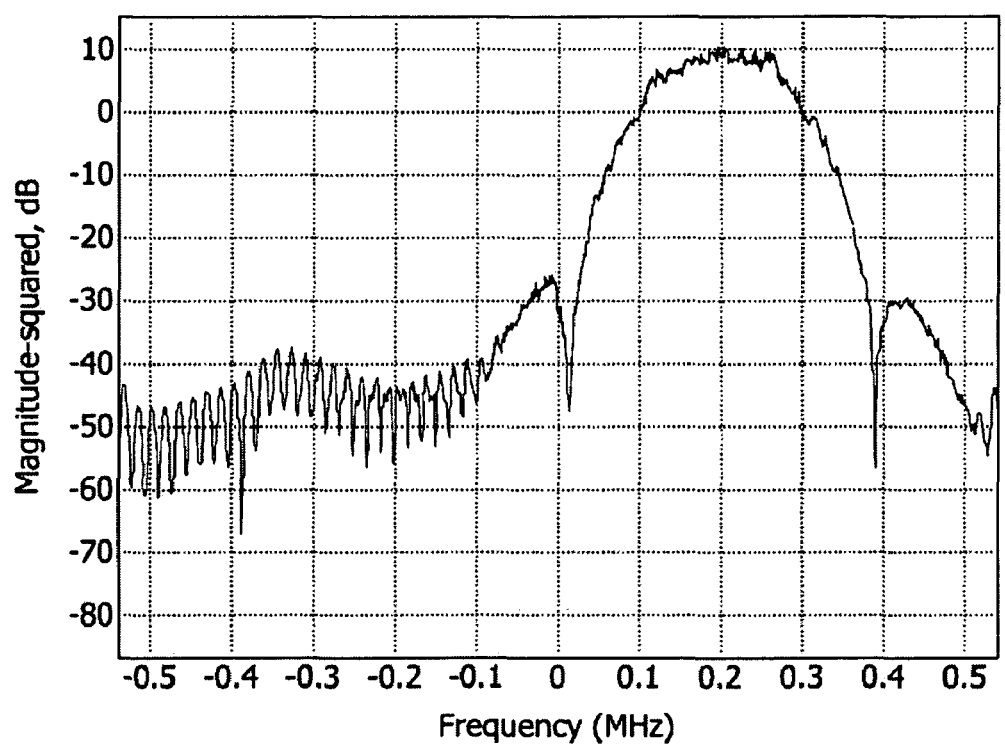

An example of a spectrum of the input signal and the same signal corrected by the frequency dependent correction system with a 64 point FFT, is shown in FIGS. 9 and 10. As well as the wanted signal at +200 kHz, it is easy to see the unwanted image of the signal at −200 kHz, which could prevent wanted signals from being received at this frequency. The image is about 20 dB below the wanted signal.

Figure 11:
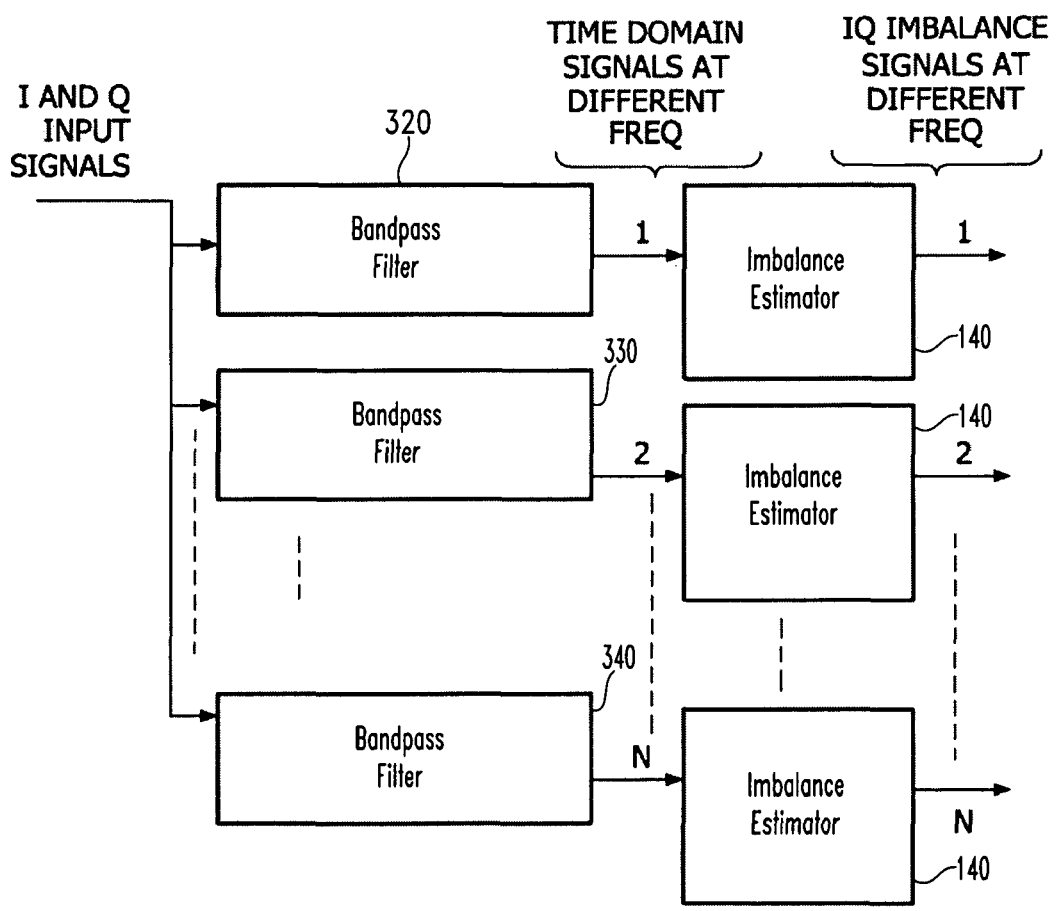
FIGS. 11 and 12 show further embodiments.

FIG. 11 shows another embodiment, similar to FIG. 5, but having the separating circuitry arranged to operate in the time domain. The input I and Q signals are fed to time domain bandpass filters 320, 330, 340, each for a different frequency band, 1, 2 ... N. The time domain signals output by these parts are then each fed to a time domain I/Q imbalance estimation circuit 140, as in FIG. 5. The filters can be implemented following established practice.

Figure 12:
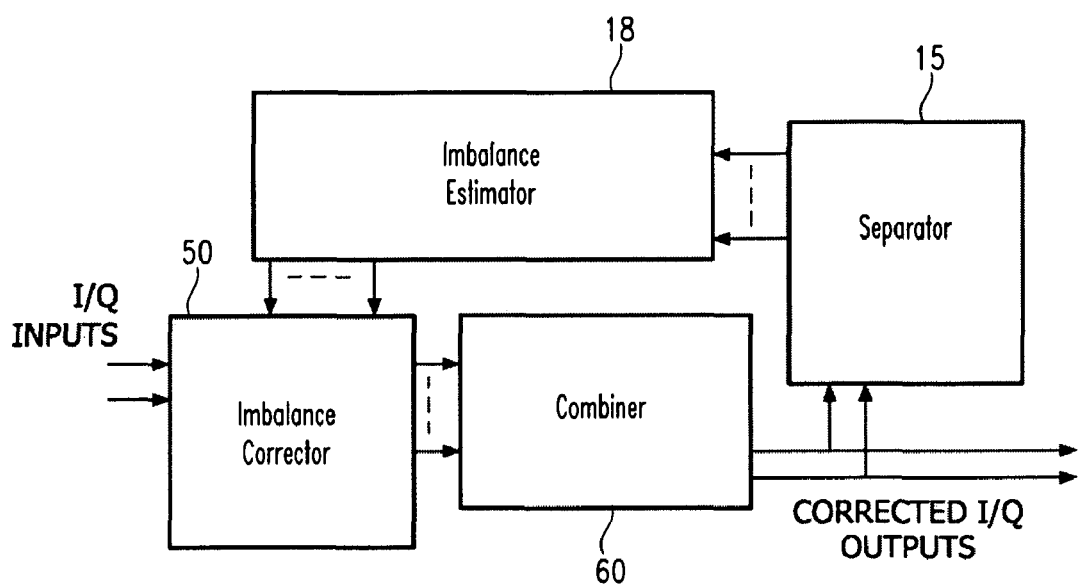

In another embodiment shown in FIG. 12, the imbalance estimation part 18 for each band is arranged to be fed from imbalance corrected output signals, rather than carrying out the correction downstream of the estimation. The I/Q imbalance correction part 50 carries out correction at each frequency band. Combining part 60 recombines the corrected I and Q signals of the different frequency bands. The corrected outputs are fed back to the I/Q estimation part 18 via a separation part 15 for separating the frequency bands. Clearly another alternative arrangement is to use the outputs of the imbalance correction part 50 as inputs to the imbalance estimation part 18, before the recombination by combining part 60, to avoid the need for separation part 15.

In the embodiments described, the I/Q mismatch compensation factors may be used to adjust the magnitude and phase response in the time domain or in the frequency domain, in the analogue or in the digital portion of a receiver. The passive I/Q mismatch calibration system can calibrate frequency dependent gain or magnitude imbalance, frequency independent magnitude imbalance, frequency dependent phase imbalance, and frequency independent phase imbalance or combinations or these. The calibration may occur for a set number of samples followed by, or accompanied by, compensation based on the analysis. In other embodiments, an iterative approach may be used to provide adaptive compensation for I/Q mismatch.

Some of the embodiments can be applied to image rejection of a low IF radio receiver for application in GSM/EDGE cellular networks. The system could also be used for many other types of radio system, such as the Zero IF receiver described in GB2215544 (Cheer).

The embodiments of the disclosure have been conceived in the context of the transmitter and receiver in cellular radio handsets targeted at the 2.5G and 3G standards. It is of potential application to any wireless communication systems and can include systems using frequency division multiple access (FDMA), time division multiple access (TDMA), and various spread spectrum techniques, such as code division multiple access (CDMA) signal modulation. GSM systems use a combination of TDMA and FDMA modulation techniques. Wireless communication devices incorporating wireless technology can include cellular radiotelephones, PCMCIA cards incorporated within portable computers, personal digital assistants (PDAs) equipped with wireless communication capabilities, and the like.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of radio apparatus and component parts therefore and which may be used instead of or in addition to features already described herein.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A signal processing apparatus for estimating I/Q imbalance in in-phase (I) and quadrature-phase (Q) input signals, comprising:
   circuitry arranged to separate different frequency components of the I and Q input signals to represent different parts of a frequency spectrum of the input signals; estimation circuitry arranged to estimate I/Q imbalance at the different parts of the frequency spectrum of the input signals wherein the circuitry arranged to separate different frequency components comprises transform circuitry for generating a frequency domain representation of the input signals and is arranged to carry out the separation in the frequency domain; and
   a converter arranged to convert the separated frequency domain representation of each frequency band to a time domain representation before the estimation.

2. The apparatus of claim 1, wherein the circuitry arranged to separate different frequency components separates transformed values into a number of frequency bins representing values in negative and positive frequency bands, and comprises means for combining corresponding values in bins representing corresponding negative and positive frequency bands.

3. The apparatus of claim 1, wherein the estimation circuitry comprises circuitry to determine an estimate of a phase imbalance and circuitry to determine an estimate of an amplitude imbalance.

4. The apparatus of claim 3, wherein the amplitude imbalance determining circuitry is arranged to determine an average difference between the amplitudes of the input signals over a period of time.

5. The apparatus of claim 3, wherein the phase imbalance determining circuitry is arranged to determine an average amount of correlation of the I input signal and the Q input signal, over a period of time.

6. The apparatus of claim 5, wherein the phase imbalance determining circuitry is arranged to operate on input signals before correction for amplitude imbalance, and having a polynomial correction circuit to compensate for the effects of amplitude imbalance on the phase imbalance determination.

7. The apparatus of claim 1, further comprising correction circuitry arranged to use the estimated imbalance to correct the input signals.

8. The apparatus of claim 7, arranged to determine the estimation on corrected input signals or on input signals before the correction.

9. The apparatus of claim 7, wherein the correction circuitry is arranged to operate on frequency domain or time domain signals.

10. The apparatus of claim 7, wherein the correction circuitry is arranged to operate based on the equations:

$$x'(t) = x(t) \cdot (1 - \text{alpha}) + \text{beta} \cdot y(t)$$

$$y'(t) = y(t) \cdot (1 + \text{alpha}) + \text{beta} \cdot x(t)$$

where alpha is a vector of amplitude imbalances at different frequency bands, beta is a vector of phase imbalances at different frequency bands, x is the I input signal and y is the Q input signal, x and y being in the form of vectors of signal values at different frequency bands.

11. The apparatus of claim 1, wherein the apparatus is in the form of a monolithic integrated circuit.

* * * * *